(12) United States Patent
Cheng et al.

(10) Patent No.: US 10,229,987 B2
(45) Date of Patent: Mar. 12, 2019

(54) EPITAXIAL AND SILICIDE LAYER FORMATION AT TOP AND BOTTOM SURFACES OF SEMICONDUCTOR FINS

(71) Applicants: International Business Machines Corporation, Armonk, NY (US); GlobalFoundries, Inc., Grand Cayman (KY)

(72) Inventors: Kangguo Cheng, Schenectady, NY (US); Zuoguang Liu, Schenectady, NY (US); Ruilong Xie, Schenectady, NY (US); Tenko Yamashita, Schenectady, NY (US)

(73) Assignees: INTERNATIONAL BUSINESS MACHINES CORPORATION, Armonk, NY (US); GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 15/815,857

(22) Filed: Nov. 17, 2017

(65) Prior Publication Data

US 2018/0076299 A1 Mar. 15, 2018

Related U.S. Application Data

(62) Division of application No. 15/361,994, filed on Nov. 28, 2016, now Pat. No. 9,882,024, which is a division
(Continued)

(51) Int. Cl.
*H01L 29/66* (2006.01)
*H01L 29/78* (2006.01)
(Continued)

(52) U.S. Cl.
CPC .... *H01L 29/66636* (2013.01); *H01L 21/0217* (2013.01); *H01L 21/02164* (2013.01); *H01L 21/02167* (2013.01); *H01L 21/02178* (2013.01); *H01L 21/28518* (2013.01); *H01L 21/324* (2013.01); *H01L 21/823418* (2013.01); *H01L 21/823431* (2013.01); *H01L 21/823468* (2013.01); *H01L 21/823481* (2013.01);
(Continued)

(58) Field of Classification Search
None
See application file for complete search history.

(56) References Cited

U.S. PATENT DOCUMENTS 8,030,144 B2 10/2011 Luning et al.
9,082,849 B2 7/2015 Yin et al.
(Continued)

OTHER PUBLICATIONS

List of IBM Patents or Patent Applications Treated as Related; (Appendix P), Filed Nov. 17, 2017; 2 pages.

*Primary Examiner* — Alexander Ghyka
(74) *Attorney, Agent, or Firm* — Cantor Colburn LLP; Vazken Alexanian

(57) ABSTRACT

A method of making a semiconductor device includes forming a fin in a substrate; depositing a first spacer material to form a first spacer around the fin; depositing a second spacer material to form a second spacer over the first spacer; recessing the first spacer and the second spacer; removing the first spacer; and performing an epitaxial growth process to form epitaxial growth on an end of the fin, along a sidewall of the fin, and adjacent to the fin.

19 Claims, 8 Drawing Sheets

Related U.S. Application Data of application No. 14/824,349, filed on Aug. 12, 2015.

(51) Int. Cl.

| | |
|---|---|
| *H01L 29/417* | (2006.01) |
| *H01L 21/8234* | (2006.01) |
| *H01L 29/06* | (2006.01) |
| *H01L 21/02* | (2006.01) |
| *H01L 21/285* | (2006.01) |
| *H01L 21/324* | (2006.01) |
| *H01L 29/45* | (2006.01) |
| *H01L 27/088* | (2006.01) |
| *H01L 29/08* | (2006.01) |
| *H01L 29/161* | (2006.01) |
| *H01L 29/165* | (2006.01) |
| *H01L 29/24* | (2006.01) |
| *H01L 29/267* | (2006.01) |

(52) U.S. Cl.
CPC ...... *H01L 27/0886* (2013.01); *H01L 29/0649* (2013.01); *H01L 29/0653* (2013.01); *H01L 29/0847* (2013.01); *H01L 29/161* (2013.01); *H01L 29/165* (2013.01); *H01L 29/24* (2013.01); *H01L 29/267* (2013.01); *H01L 29/41791* (2013.01); *H01L 29/45* (2013.01); *H01L 29/6653* (2013.01); *H01L 29/6656* (2013.01); *H01L 29/66545* (2013.01); *H01L 29/66795* (2013.01); *H01L 29/785* (2013.01); *H01L 29/7848* (2013.01); *H01L 29/7851* (2013.01); *H01L 2029/7858* (2013.01)

(56) References Cited

U.S. PATENT DOCUMENTS

| | | |
|---|---|---|
| 9,431,540 B2 | 8/2016 | Liu et al. |
| 2014/0183605 A1* | 7/2014 | Mochizuki ............ H01L 29/785 257/288 |
| 2014/0252482 A1* | 9/2014 | Huang ............... H01L 29/66795 257/349 |
| 2014/0273369 A1* | 9/2014 | Wei ................. H01L 21/823821 438/232 |
| 2017/0047411 A1 | 2/2017 | Cheng et al. |
| 2017/0077266 A1 | 3/2017 | Cheng et al. |

* cited by examiner

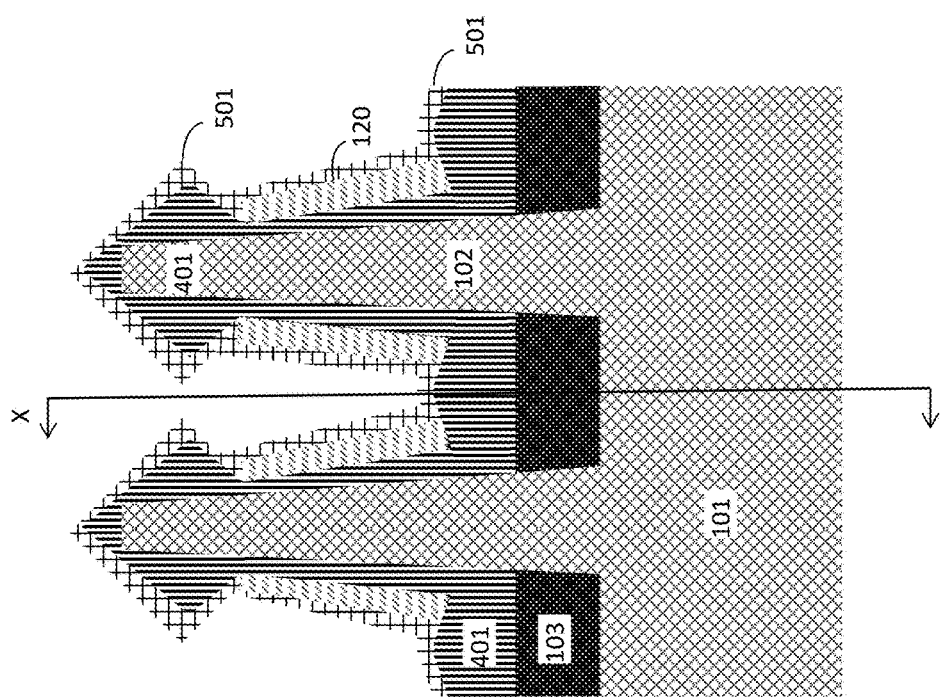

US 10,229,987 B2

EPITAXIAL AND SILICIDE LAYER FORMATION AT TOP AND BOTTOM SURFACES OF SEMICONDUCTOR FINS

PRIORITY

This application is a divisional of and claims priority from U.S. patent application Ser. No. 15/361,994, filed on Nov. 28, 2016, entitled "EPITAXIAL AND SILICIDE LAYER FORMATION AT TOP AND BOTTOM SURFACES OF SEMICONDUCTOR FINS," which is a divisional of and claims priority from U.S. patent application Ser. No. 14/824, 349, filed on Aug. 12, 2015, entitled "EPITAXIAL AND SILICIDE LAYER FORMATION AT TOP AND BOTTOM SURFACES OF SEMICONDUCTOR FINS," each application is incorporated herein by reference in its entirety.

BACKGROUND

The present invention generally relates to metal-oxide-semiconductor field-effect transistors (MOSFET), and more specifically, to fin-type field-effect transistors (FinFET).

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

The FinFET is a type of MOSFET. The FinFET is a double-gate silicon-on-insulator (SOI) device that mitigates the effects of short channels and reduces drain-induced barrier lowering. The "fin" refers to the narrow channel between source and drain regions. A thin insulating oxide layer on either side of the fin separates the fin from the gate.

SUMMARY

In one embodiment of the present invention, a method of making a semiconductor device includes forming a fin in a substrate; depositing a first spacer material to form a first spacer around the fin; depositing a second spacer material to form a second spacer over the first spacer; recessing the first spacer and the second spacer; removing the first spacer; and performing an epitaxial growth process to form epitaxial growth on an end of the fin, along a sidewall of the fin, and adjacent to the fin.

In another embodiment, a method of making a semiconductor device includes forming a pair of fins in a substrate; forming a shallow trench isolation region around a portion of the pair of fins; depositing a first spacer material to form a first spacer around each of the fins in the pair of fins; depositing a second spacer material to form a second spacer over the first spacer; recessing the first spacer and the second spacer; removing the first spacer and a portion of the STI region under the second spacer; performing an epitaxial growth process to form epitaxial growth on ends, sidewalls, and between fins; and depositing a liner over the epitaxial growth.

Yet, in another embodiment, a semiconductor device includes fins patterned in a substrate; and epitaxial growth on ends of the fins, along a sidewalls of the fins, and between the fins.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-5B illustrate an exemplary method of making a semiconductor device according to embodiments of the present invention, in which:

FIG. 1 is a cross-sectional side view of fins with a first spacer and a second spacer along fin sidewalls;

FIG. 2 is a cross-sectional side view after partially recessing the first and second spacers;

FIG. 4 is a cross-sectional side view after epitaxial growth around the fins;

FIG. 5A is a cross-sectional side view after depositing a liner over the epitaxial growth;

FIG. 5B is a cross-sectional side view through the X-axis of FIG. 5A; and

DETAILED DESCRIPTION

Figure 1:
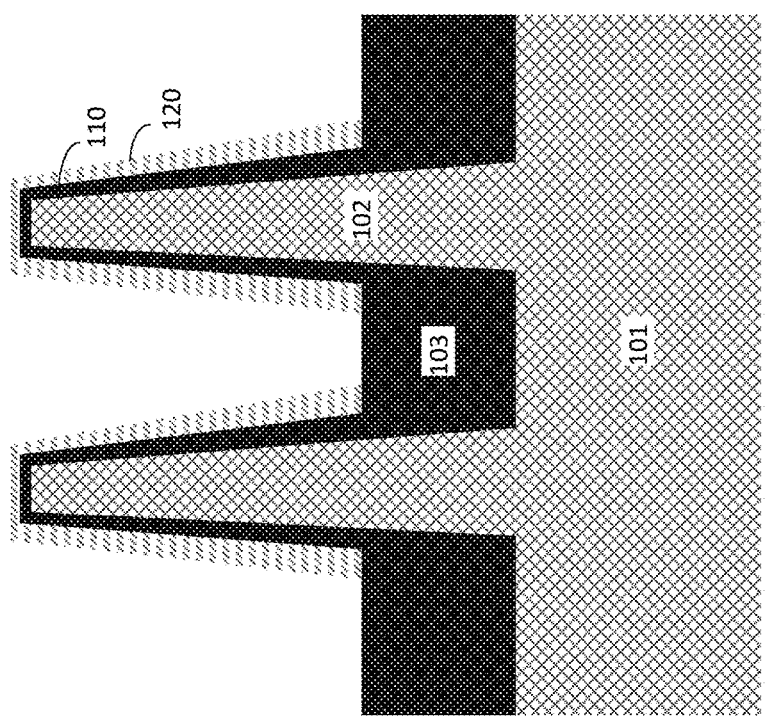

In highly scaled FinFETs, non-uniform or low junction doping in the source/drain regions may be problematic. Non-uniform or low junction doping may result in distributed device resistance. Further, in extremely scaled FinFETs, the limited contact area may result in high source/drain contact resistance.

Accordingly, embodiments of the present invention provide methods of making semiconductor devices with increased doping concentration at the fin source/drain regions. The devices are doped from both ends of the fin. The resulting semiconductor devices have current flow through the top and bottom silicide, which reduces distributed resistance, particularly when the fin height increases. Embodiments of the inventive structure and methods can increase the contact area to reduce source/drain contact resistance and device external resistance. It is noted that like reference numerals refer to like element s across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Turning now to the Figures, FIGS. 1-5B illustrate an exemplary method of making a semiconductor device according to embodiments of the present invention. FIG. 1 is a cross-sectional side view of fins 102 with a first spacer 110 and a second spacer 120 along fin sidewalls. The fins 102 are patterned in a substrate 101. The gate (not shown) runs perpendicular to the fins 102.

Non-limiting examples of suitable materials for the substrate 101 include silicon, sapphire, germanium, gallium arsenide (GaAs), an alloy of silicon and germanium, indium phosphide (InP), or any combination thereof. Other examples of suitable substrates 101 include silicon-on-insulator (SOI) substrates with buried oxide (BOX) layers.

The thickness of the substrate 101 is not intended to be limited. In one aspect, the thickness of the substrate 101 is in a range from about 2 millimeters (mm) to about 6 mm. In another aspect, the thickness of the substrate 101 is in a range from about 2 mm to about 3 mm.

To form the fins 102, lithography and etching are performed. Lithography can include forming a photoresist (not shown) on the substrate 101, exposing the photoresist to a desired pattern of radiation, and then developing the exposed photoresist with a resist developer to provide a patterned photoresist on top of the substrate 101. At least one etch is employed to transfer the pattern from the patterned photoresist into the substrate 101. The etching process may be a dry etch (e.g., reactive ion etching (RIE), plasma etching, ion beam etching, or laser ablation). The etching process may be a wet chemical etch (e.g., potassium hydroxide (KOH)). Both dry etching and wet chemical etching processes may be used. After transferring the pattern, the patterned photoresist is removed utilizing resist stripping processes, for example, ashing.

The fin 102 height may generally vary, as it depends on the type of device, and is not intended to be limited. In one aspect, the fin 102 height is in a range from about 90 nm to about 120 nm. In another aspect, the fin 102 height is in a range from about 100 nm to about 110 nm.

One or more fins 102 may be patterned in the substrate 101. For example, one fin, a pair of fins, or an array of fins may be formed.

A STI process is performed to form the STI regions 103 around the fins 102. The STI regions 103 are isolation regions formed by etching trenches in the substrate and then filling the trenches with, for example, silicon dioxide ($SiO_2$). Alternatively, the trenches may be lined with a silicon oxide liner formed by a thermal oxidation process and then filled with additional silicon dioxide or another material.

A dielectric spacer material, for example, silicon dioxide, is deposited over the exposed fins 102 to form the first spacer 110. The first spacer 110 lines the fin 102 sidewalls. The dielectric spacer material may be deposited by a deposition process, for example, chemical vapor deposition (CVD) or physical vapor deposition (PVD). The material forming the first spacer 110 may be an insulating material. Non-limiting examples of suitable materials for the first spacer 110 include silicon nitride, silicon oxide, silicon dioxide, aluminum oxide, or any combination thereof.

In one aspect, the first spacer 110 has a thickness in a range from about 2 nanometers (nm) to about 10 nm. In another aspect, the first spacer 110 has a thickness in a range from about 3 to about 5 nm.

A second spacer material is deposited over the first spacer 110 to form the second spacer 120. The material forming the second spacer 120 may be deposited using a deposition process, for example, CVD or PVD. The material forming the second spacer 120 may be a low-k material. For example, the material forming the first spacer 110 may include Si, N, and at least one element selected from the group consisting of C and B. Additionally, the material forming the first spacer 120 may include Si, N, B, and C. Non-limiting examples of suitable materials for the first spacer 110 include SiBN, SiCN, SiBCN, SiCBN, or any combination thereof.

In one aspect, the second spacer 120 has a thickness in a range from about 3 nm to about 12 nm. In another aspect, the second spacer 120 has a thickness in a range from about 5 nm to about 10 nm.

Figure 2:
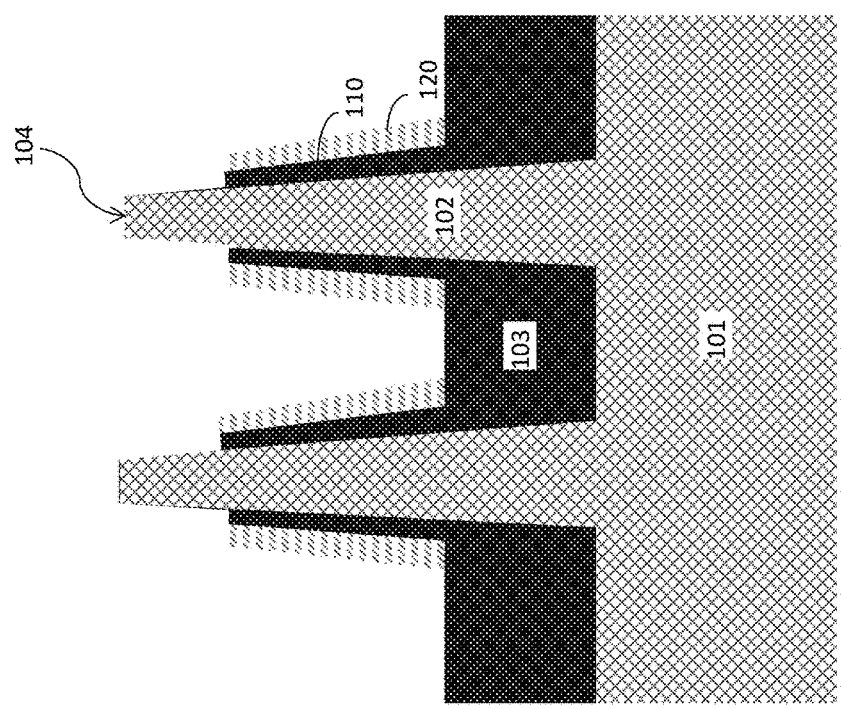

FIG. 2 is a cross-sectional side view after partially recessing the first and second spacers 110, 120 to expose the end 104 of the fin 102. An etching process is performed to partially pull down the first and second spacers 110, 120. The etching process may be a dry etching process, for example, RIE process. The etching process is selective and will only remove the first and second spacers 110, 120, without penetrating the fin 102. Selective etching is performed to remove at least 20 nm of the first and second spacer 110, 120. In other embodiments, about 20 to about 40 nm of the first and second spacer 110, 120 length is removed.

Figure 3A:
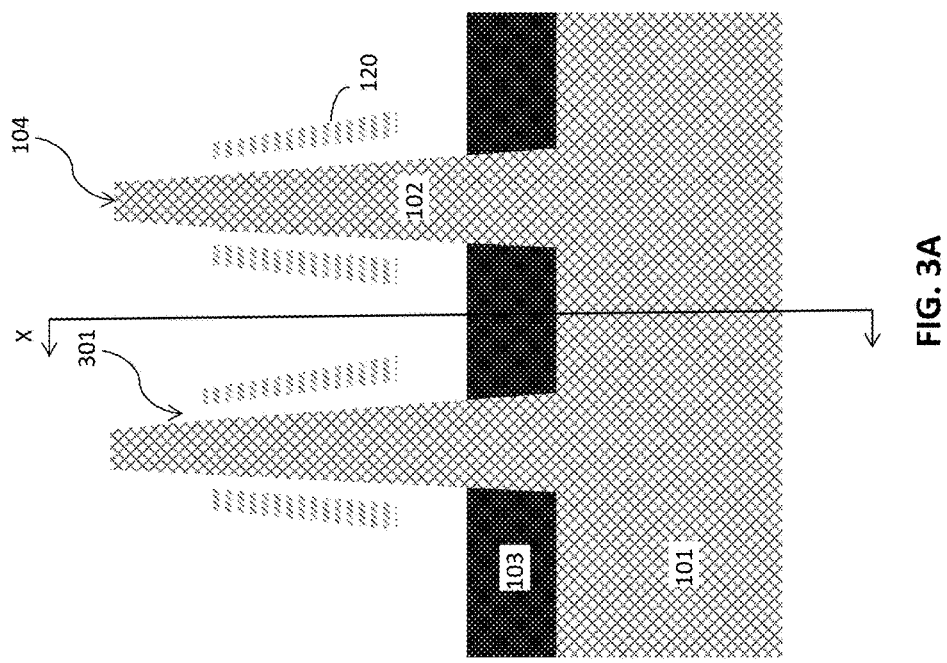
FIG. 3A is a cross-sectional side view after removing the first spacer along the fin sidewalls.
Figure 3B:
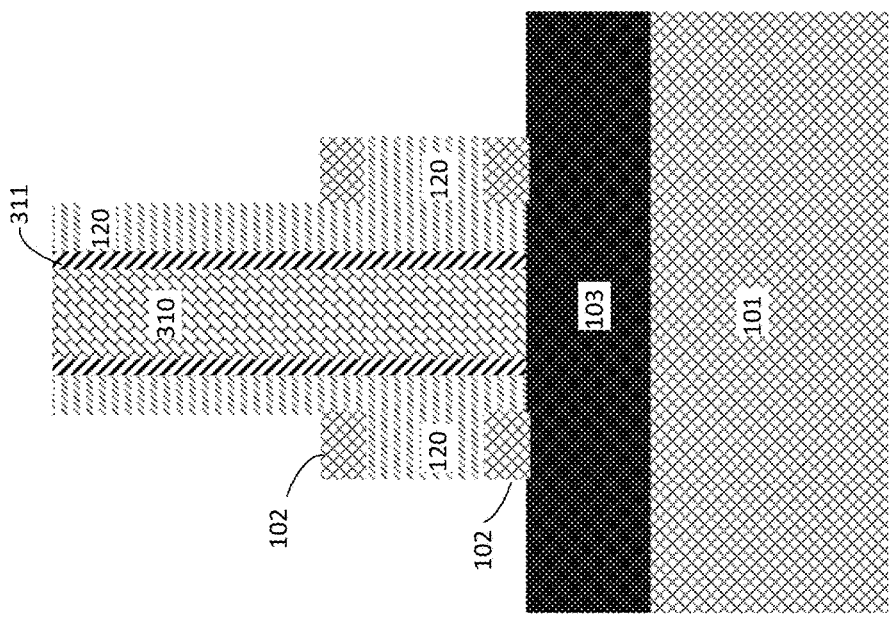
FIG. 3B is a cross-sectional side view through the X-axis of FIG. 3A.

FIG. 3A is a cross-sectional side view after removing the first spacer 110 along the fin 102 sidewalls, leaving a gap between the second spacer 120 and the fin 102. When the first spacer 110 and the STI region 103 are the same material, for example, silicon dioxide, a portion of the STI region 103 may be removed when the first spacer 110 is removed in a single step. However, when the first spacer 110 and the STI region 103 include different materials, more than one etching step may be performed to form a structure as shown in FIG. 3. The second spacer 120 is anchored in the gate, which runs perpendicular to the fins 102 (see FIG. 3B). A wet etching process may be performed to remove the first spacer 110 and a portion of the STI region 103. Non-limiting examples of suitable wet etchants include buffered oxides, buffered hydrofluoric acid (HF), hydrofluoric nitric acid (HNA), and phosphoric acid. In this process, the etch chemistry is selective with respect to the material of the second spacer 120 such that it remains substantially intact.

Figure 5B:
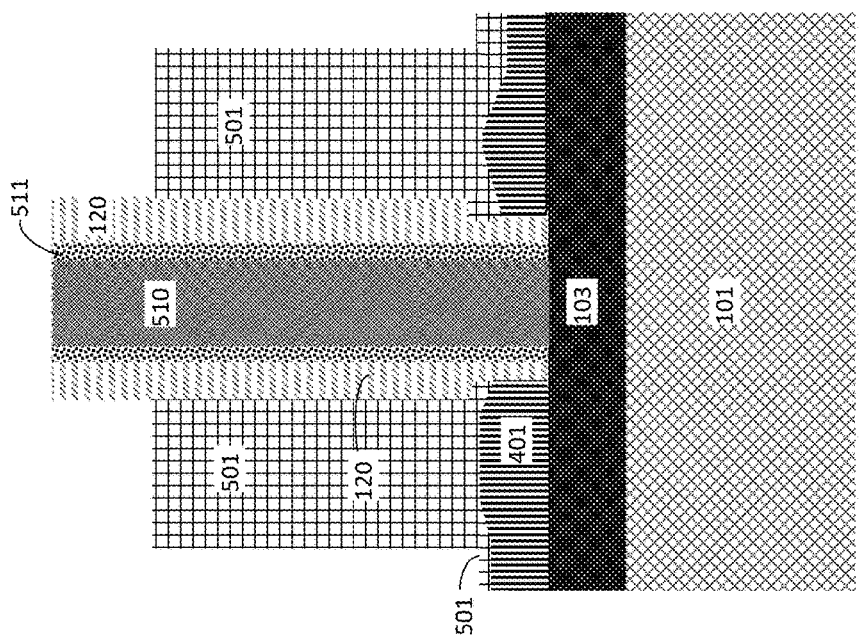

FIG. 3B is a cross-sectional side view through the X-axis of FIG. 3A, showing the second spacer 120 anchored in the "dummy" gate 310. The dummy gate 310 is filled with a replacement material, for example, polysilicon. The replacement material will be replaced by a conductive metal after forming source/drain regions to form a metal gate, as shown in FIG. 5B. The dummy gate 310 is surrounded by a dielectric spacer 311, which lines the sidewalls of the dummy gate 310. The material forming the second spacer 120 is disposed over the dielectric spacer 311.

Figure 4:
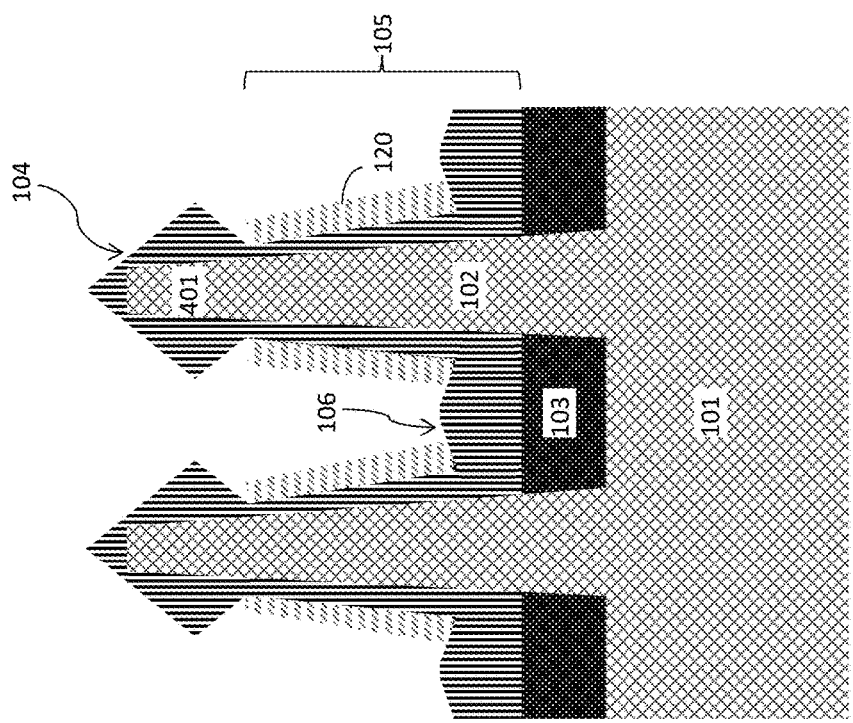

FIG. 4 is a cross-sectional side view after forming epitaxial growth 401 around the fins 102. An epitaxial growth process is performed to deposit a crystalline layer onto the crystalline substrate 101 beneath. The underlying substrate 101 acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process.

The epitaxial growth 401 is deposited onto all exposed sidewalls of the fin 102, filling the space where the first spacer 110 was formed (see FIG. 3). The epitaxial growth replaces the first spacer 110 and fills the gap 301, as shown in FIG. 4. The epitaxial growth 401 also fills the region beneath the second spacers 120. The epitaxial growth 401 forms the source/drain region of the semiconductor device.

The epitaxial growth 401 covers the end 104 of the fin 102 and the exposed sidewalls 105 protruding from the STI region 103. The epitaxial growth 401 over the end 104 of the fin 102 may be diamond-shaped or triangular-shaped. The epitaxial growth 401 over the end 104 of the fin 102 is continuous with the growth along the exposed sidewalls 105.

To form the epitaxial growth of, for example, SiGe doped with B, into a diamond-like shape, precursors such as dichlorosilane, $GeH_4$, and $B_2H_6$ may be combined with HCl and $H_2$ gases to form carrier Si, Ge, and B species. The carrier species are deposited onto the substrate under low vacuum pressure (e.g., about 30 to 100 Torr) and at a temperature of, for example, 300-500° C.

To form the epitaxial growth of, for example, Si doped with P, into a diamond-like shape, precursors such as dichlorosilane and $PH_3$ may be used to form carrier Si and P species. The carrier species are deposited onto the substrate in a low vacuum chamber (e.g, at a pressure of about 30 to about 100 Torr) and at a temperature of about 300 to about 50° C.

The thickness of the epitaxial growth 401 over the end 104 of the fin 102 may generally vary and is not intended to be limited. In one aspect, the thickness of the epitaxial growth 401 over the end 104 of the fin 102 is in a range from about 2 nm to about 10 nm. In another aspect, the thickness of the epitaxial growth 401 over the end 104 of the fin 102 is in a range from about 2 nm to about 6 nm.

In one aspect, the thickness of the epitaxial growth 401 along the exposed sidewalls 105 is in a range from about 2 nm to about 10 nm. In another aspect, the thickness of the epitaxial growth 401 along the exposed sidewalls 105 is in a range from about 3 nm to about 7 nm.

The epitaxial growth 401 also extends in the region 106 between the fins 102 directly over the STI region 103. When only one fin 102 is present, the region 106 may be any region adjacent to the fin 102. The epitaxial growth 401 along the exposed sidewalls 105 is continuous with the growth in the region 106 between the fins 102. The epitaxial growth 104 in the region 106 between the fins 102 merges to form a triangular or diamond-shaped growth. However, the epitaxial growth 104 in the region 106 between the fins 102 is not merged with the growth over the end 104.

The thickness of the epitaxial growth 401 in the region 106 between the fins 102 may generally vary and is not intended to be limited. In one aspect, the thickness of the epitaxial growth 401 in the region 106 between the fins 102 is in a range from about 15 nm to about 30 nm. In another aspect, the thickness of the epitaxial growth 401 in the region 106 between the fins 102 is in a range from about 18 nm to about 28 nm.

The epitaxial silicon (Si) or silicon germanium (SiGe) is doped during deposition by adding a dopant or impurity to form a silicide. Because the doped epitaxial silicon is all around and between the fins 102, the dopant concentration in the source/drain region is increased, which provides a sharp junction, or a junction in which the gradient of n to p or p to n junction areas is abrupt. The epitaxial silicon may be doped with an n-type dopant (e.g., phosphorus) or a p-type dopant (e.g., boron), depending on the type of transistor. The silicon epitaxy is doped to a dopant concentration in a range from about $10^{19}/cm^3$ to about $5 \times 10^{21}/cm^3$ atoms/$cm^3$. In one aspect, the silicon epitaxy is doped to a dopant concentration in a range from about $10^{20}/cm^3$ to about $10^{21}/cm^3$ atoms/$cm^3$.

The epitaxial growth 401 extends from both ends of the fin 102, which provides an enhanced strain effect. The epitaxial growth 401 forms the source/drain regions and lowers the distributed device resistance. The epitaxial growth 401 all around the fin also lowers contact resistance because of the increased contact area due to substantially uniform doping from both ends of the fin 102. Further, the doped epitaxial growth 401 extending from both ends of the fin 102 allows current to flow through the top and bottom of the fin 102, which is advantageous for a tall fin containing device.

FIG. 5A is a cross-sectional side view after depositing a liner 501 over the epitaxial growth 401. The epitaxial growth 401 also covers the second spacers 120. In some embodiments, the liner 501 wraps around substantially all of the epitaxial growth 401. A metal silicide film is deposited to form the liner 501. The metal silicide film is formed by performing a thermal treatment to a metallic film. The metallic film can be deposited by performing an evaporation process or a sputtering process. The metallic film is annealed by heating inside a furnace or performing a rapid thermal treatment in an atmosphere containing pure inert gases (e.g., nitrogen or argon) so that the metal reacts with exposed epitaxial growth 401 to form a metal silicide layer. Non-limiting examples of suitable metal silicide materials include titanium silicide, tungsten silicide, cobalt silicide, nickel silicide, molybdenum silicide, platinum silicide, or any combination thereof.

FIG. 5B is a cross-sectional side view through the X-axis of FIG. 5A, showing the gate 510 arranged perpendicular to the fins 102. The liner 501 extends over and covers the epitaxial growth 401 over the fins 102 (see FIG. 5A).

The gate 510 may include a conductive metal, for example, aluminum (Al), platinum (Pt), gold (Au), tungsten (W), titanium (Ti), or any combination thereof. The conductive metal may be deposited by a known deposition process, for example, CVD, PECVD, PVD, plating, thermal or e-beam evaporation, and sputtering.

The conductive metal forming the gate 510 is deposited over a high-k dielectric liner 511. The high-k dielectric liner 511 may be a dielectric material having a dielectric constant greater than 4.0, 7.0, or 10.0. Non-limiting examples of suitable materials for the high-k dielectric liner include oxides, nitrides, oxynitrides, silicates (e.g., metal silicates), aluminates, titanates, nitrides, or any combination thereof. Other non-limiting examples of suitable high-k dielectric materials include $HfO_2$, $ZrO_2$, $Al_2O_3$, $TiO_2$, $La_2O_3$, $SrTiO_3$, $LaAlO_3$, $Y_2O_3$, a pervoskite oxide, or any combination thereof. The high-k dielectric material layer may be formed by known deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

Figure 6:
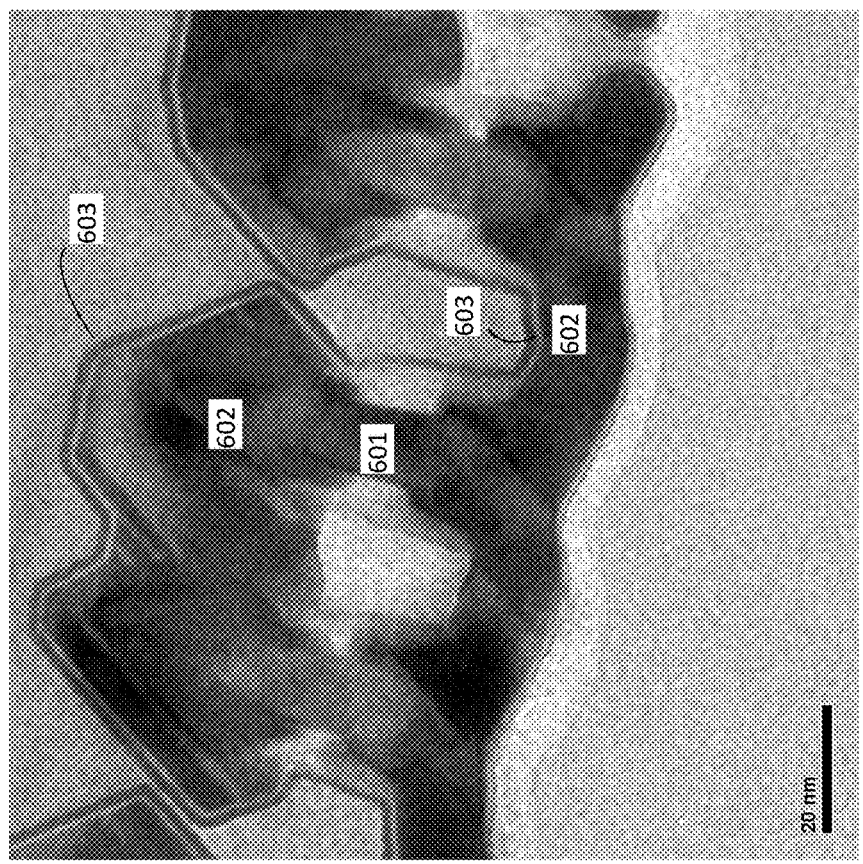
FIG. 6 is an electron micrograph image of epitaxial growth on both ends of fins.

FIG. 6 is an electron micrograph image of doped epitaxial growth 602 on both ends of fins 601. The doped epitaxial growth 602 is disposed over the fins 601 and between the fins 601. A liner 603 including a metal silicide material is disposed over the doped epitaxial growth 602. The doped epitaxial growth 602 can provide stress to the fins 601 from both top and bottom of the fins 601, which enhances carrier mobility.

As described above, embodiments of the present invention provide methods of making semiconductor devices with increased doping concentration at the fin source/drain regions. The devices are doped from both the ends of the fin. The resulting semiconductor devices may have current flow through the top and bottom silicide, which reduces distributed resistance, particularly when the fin height increases. Embodiments of the inventive structure and methods can increase the contact area to reduce source/drain contact resistance and device external resistance.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device, the method comprising:
   forming a pair of fins in a substrate;
   forming a shallow trench isolation region around a portion of the pair of fins;
   depositing a first spacer material to form a first spacer around each of the fins in the pair of fins;
   depositing a second spacer material to form a second spacer over the first spacer;
   recessing the first spacer and the second spacer;
   removing the first spacer and a portion of the STI region under the second spacer, removing the first spacer leaving a gap between the second spacers and the fins;
   performing an epitaxial growth process to form epitaxial growth on ends, sidewalls, and between fins; and
   depositing a liner over the epitaxial growth.

2. The method of claim 1, wherein the epitaxial growth on the ends of the fins is diamond-shaped.

3. The method of claim 1, wherein the epitaxial growth on the ends of the fins has a thickness in a range from about 2 to about 10 nm.

4. The method of claim 1, wherein the epitaxial growth between the fins has a thickness in a range from about 15 to about 30 nm.

5. The method of claim 1, wherein the liner includes a metal silicide material.

6. The method of claim 1, wherein the epitaxial growth has a thickness in a range from about 2 to about 10 nm.

7. The method of claim 1, wherein the liner is a metal silicide liner.

8. The method of claim 7, wherein the metal silicide liner wraps around all of the epitaxial growth.

9. The method of claim 8, wherein the first spacer material is a dielectric spacer material.

10. A method of making a semiconductor device, the method comprising:
    forming a pair of fins in a substrate;
    forming a shallow trench isolation region around a portion of the pair of fins;
    depositing a first spacer material to form a first spacer around each of the fins in the pair of fins, the first spacer material comprising a dielectric spacer material;
    depositing a second spacer material to form a second spacer over the first spacer, the second spacer material comprising silicon, nitrogen, and either carbon or boron;
    recessing the first spacer and the second spacer to expose an end of a fin;
    removing only the first spacer and a portion of the STI region under the second spacer, leaving a gap between the second spacer and the fin;
    performing an epitaxial growth process to form epitaxial growth on ends, sidewalls, and between fins; and
    depositing a liner over the epitaxial growth.

11. The method of claim 10, wherein the epitaxial growth on the ends of the fins is diamond-shaped.

12. The method of claim 10, wherein the epitaxial growth on the ends of the fins has a thickness in a range from about 2 to about 10 nm.

13. The method of claim 10, wherein the epitaxial growth between the fins has a thickness in a range from about 15 to about 30 nm.

14. The method of claim 10, wherein the liner includes a metal silicide material.

15. The method of claim 10, wherein the epitaxial growth covers the second spacers.

16. The method of claim 10, wherein the epitaxial growth has a thickness in a range from about 2 to about 10 nm.

17. The method of claim 10, wherein the liner is a metal silicide liner.

18. The method of claim 17, wherein the metal silicide liner wraps around substantially all of the epitaxial growth.

19. The method of claim 18, wherein the second spacer material is a low k dielectric material.

* * * * *